(12) United States Patent
Swain (10) Patent No.: US 6,323,635 B1
(45) Date of Patent: Nov. 27, 2001

(54) MER2: MAGNETIC ERROR REDUCTION DOUBLED

(76) Inventor: William H. Swain, 4662 Gleason Ave., Sarasota, FL (US) 34242

( * ) Notice: Subject to any disclaimer, the term of this patent is extended or adjusted under 35 U.S.C. 154(b) by 0 days.

(21) Appl. No.: 09/419,941

(22) Filed: Oct. 18, 1999

(51) Int. Cl.$^7$ .............................. G01R 1/20; G01R 33/00; G01R 33/04; H01F 30/12; H01F 38/28

(52) U.S. Cl. .................. 324/127; 324/126; 324/117 R; 324/76.75; 324/253; 323/358

(58) Field of Search .................... 324/126, 127, 324/117 R, 207.15, 76.11, 76.75, 253; 323/358

(56) References Cited

U.S. PATENT DOCUMENTS

| | | | |
|---|---|---|---|
| 3,629,693 | * 12/1971 | Anderson | 323/358 |
| 3,768,011 | * 10/1973 | Swain | 324/117 R |
| 5,053,695 | * 10/1991 | Canter | 324/117 R |

* cited by examiner

*Primary Examiner*—Safet Metjahic
*Assistant Examiner*—Anjan K Deb (57) ABSTRACT

A Swain type direct current clamp-on sensor called MER2 is disclosed with improved magnetic error reduction from undesired magnetic fields generated by noise sources for accurate measurement of low currents. The sensor is comprised of a split core with non uniform magnetic structure designed to concentrate the magnetomotive force generated by the current being measured, and also by the switching magnetomotive force, through the windings near the lips of the sensor for better signal to noise ratio. The sensor core has non-uniform windings with greater ampere-turns near the lips than in other sectors of core remote from the lips so that the flux density of magnetic material in and near the lips is better switched. Furthermore, there is a provision for combining and adjusting current signals such that the noise is largely canceled. A method of making the direct current clamp-on MER2 is also disclosed.

7 Claims, 5 Drawing Sheets

Fig. 1.

Prior Art

Prior Art

MER2: MAGNETIC ERROR REDUCTION DOUBLED

CROSS REFERENCE

This invention relates to U.S. Pat. No. 3,768,011; and also to copending applications Ser. No. 08/579,395 now abandoned, and Ser. No. 09/206,960.

MEC and MER are described in copending application Ser. No. 08/579,395.

FEDERAL SPONSORSHIP

None.

REFERENCE TO A "MICROFICHE APPENDIX"

None.

BACKGROUND OF THE INVENTION

1) Field of the Invention

This invention is an improvement on the inventor's prior work. Swain's U.S. Pat. No. 3,768,011 includes teaching of a clamp-on DC ammeter. Swain's application Ser. No. 08/579,395 includes teaching of a better clamp-on DC Ammeter. This MER2 invention teaches how to build still better sensors for clamp-on DC Ammeters for measuring continuous electrical current. MEC and MER are described in copending application Ser. No. 08/579,395.

2) Description of the Related Art

We build clamp-on DC Ammeters for measuring direct current as small as 5 milliamperes. Measurement accuracy can be damaged in many ways. One is zero offset error. This can be due to several things, one of which is the non-uniform magnetic field set up by magnetized material relatively close to the sensor. Copending application Ser. No. 08/579,395 reduced this error, but generally does not eliminate it. This invention teaches a counter intuitive way to still further reduce error due to nearby magnets so as to get even greater accuracy. A by-product is that the sensor's zero offset error due to the generally uniform magnetic field of the Earth is also reduced.

BRIEF SUMMARY OF THE INVENTION

The standard sensors for clamp-on DC Ammeters, called Swain Meters®, have for many years been constructed to resemble, in so far as practical, a split core toroid. This is because a toroid is widely accepted as the form of the highest quality transformers. Core symmetry and winding uniformity were accepted as keys to avoiding zero offset error due to a magnet acting on the sensor. Swain's U.S. Pat. No. 3,768,011 has numerous references to toroid core symmetry and winding uniformity. See columns 7, 8, 15, and 16. The "magnet" can be the Earth's uniform magnetic field, or the non-uniform field of a nearby magnet. Nearby magnets can be found in steel pipe used for transporting natural gas, or in an alternator in a car. Zero offset error is a problem, especially when the current to be measured is small and continuous.

Accuracy was substantially improved using the teaching of copending patent application Ser. No. 08/579,395 which includes the MER Meter™. Zero offset error due to local magnets was reduced by 2 or 3 to one. We used 2 or 3 times as much ampere turn magnetomotive force $H_{sm}$ to switch the flux density β in the steel core of the sensor. But still the core and winding structure were as uniform as practicable. We all thought this was best.

While evaluating a series of sensors, by the grace of God I realized that the lips were the big problem and that I could improve the lips by using extra MER teaching close to the lips. This idea was different from prior art—use a non-uniform winding—a higher ampere turn concentration $H_{sm}$ to switch the flux density in the core near the lips. We call this the MER2 structure.

It worked. With the MER2, the zero offset error due to local magnets was still further reduced to ½ or ⅓ that of the MER Meter usage. The new non-uniform sensor is at least twice as resistant to local magnets.

A pleasing byproduct appears to be less zero offset error due to the uniform Earth's magnetic field.

Now that a non-uniform winding is proven beneficial, I expect we will get superior results when we make non-uniform cores and lips.

BRIEF DESCRIPTION OF THE DRAWINGS

Table 1 is a comparison of test results on three sensors having 5" diameter aperture.

DETAILED DESCRIPTION OF THE INVENTION

Introduction

The sensor is the subject of this invention.

Clamp-on direct current ammeters for measuring continuous electrical current have for many years been made and sold by the William H. Swain Co. They are called DC Amp Clips or Swain Meters®. The sensors are called Sea Clip® or Sea Clamp™. All use the teaching of U.S. Pat. No. 3,768,011.

Generally, each DC Amp Clip includes an indicator and a sensor. The indicator is the "Meter box", having electronics, a meter, battery, range switch, etc. The sensor is a clip (use one hand to squeeze handles and open lips), or a clamp (use two hands to separate a pair of semicircular "C's" and place them around a pipe using thumb nuts). This invention is primarily concerned with sensors—especially clips in sizes ¾" to 6" diameter aperture. But clamps in sizes 8" to 60" or more diameter aperture are also of interest, especially the smaller ones.

The primary focus of this invention is reducing the error due to zero offset caused by magnetic fields either stationary or moving with respect to the sensor, i.e., Noise N. I have identified two types of magnetic field. One is uniform, usually due to the magnetic intensity ($H_u$) of the Earth. The other is non-uniform, due to the large change in magnetic field intensity ($H_n$) over the dimensions of the sensor.

Figure 3:
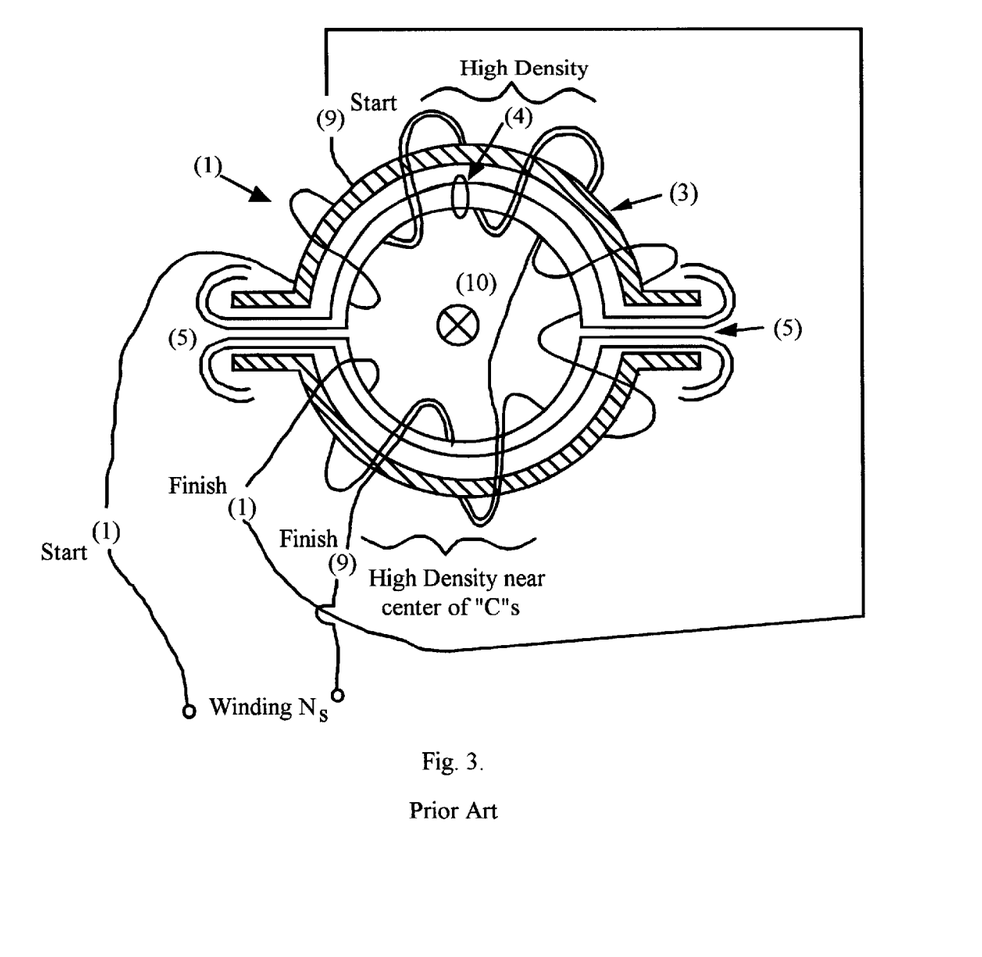
FIG. 3 is a schematic illustration of a small typical ¾" diameter aperture sensor.

$H_u$ is illustrated in FIG. 2 of copending patent application Ser. No. 08/579,395. $H_n$ is shown in FIG. 3

The main concern here is $H_n$, the non-uniform field usually associated with a magnet fairly close to the sensor.

We built fine standard sensors for years. These always approximated a uniformly wound toroid to the extent feasible. We were never satisfied with the relatively large zero offset error resulting from nearby magnets. Then it was discovered that 2 or 3 times more ampere magnetomotive force $H_{sm}$ would improve the signal to noise ratio—SNR by a factor of 2 or more. Using this MER Meter™ teaching, the zero offset error due to nearby magnets was reduced, but it was still more than desired.

By the grace of God I realized, while examining various sensors and their sensitivity to magnets, that the lips were the primary source of zero offset error. And moreover, driving that part of the core near the lips with especially large $H_{sm}$ ("MER the lips") would further reduce zero offset error. It worked! MER2 was built.

Figure 4:
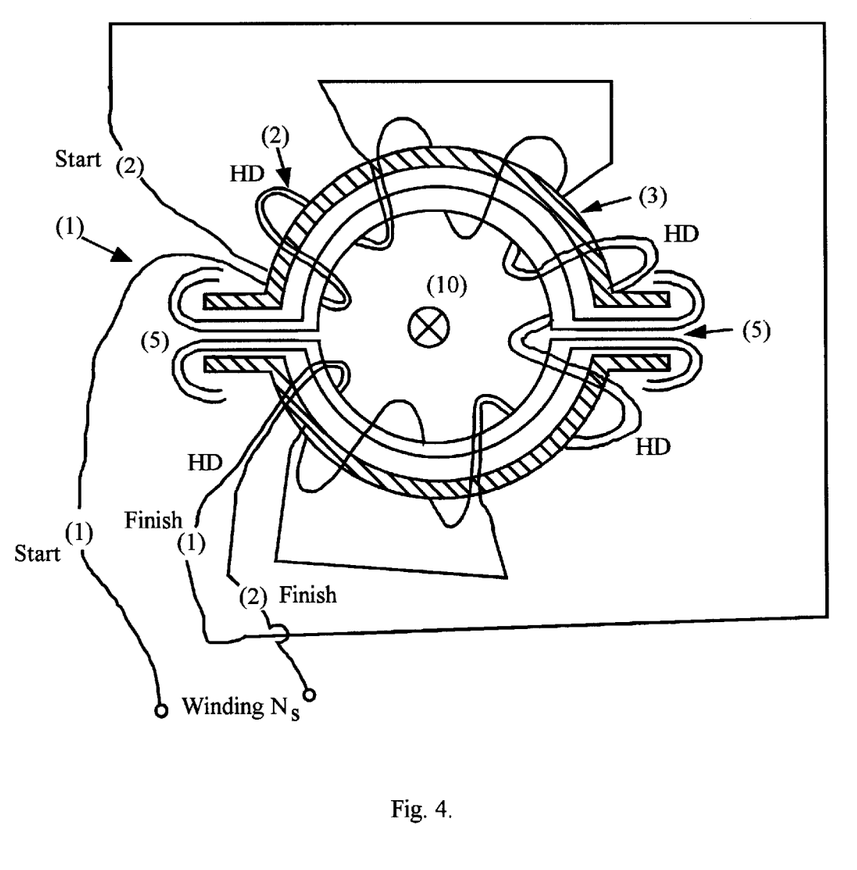
FIG. 4 is a schematic representation of a preferred non-uniform winding form of the invention.

The "Discovery" is shown on page 11, application Ser. No. 08/579,395. The Essential Characteristic is illustrated in FIG. 4, $H_{sm}$ is shown as $I_{sm}$ in FIGS. 4 and 5, ibid.

Figure 5:
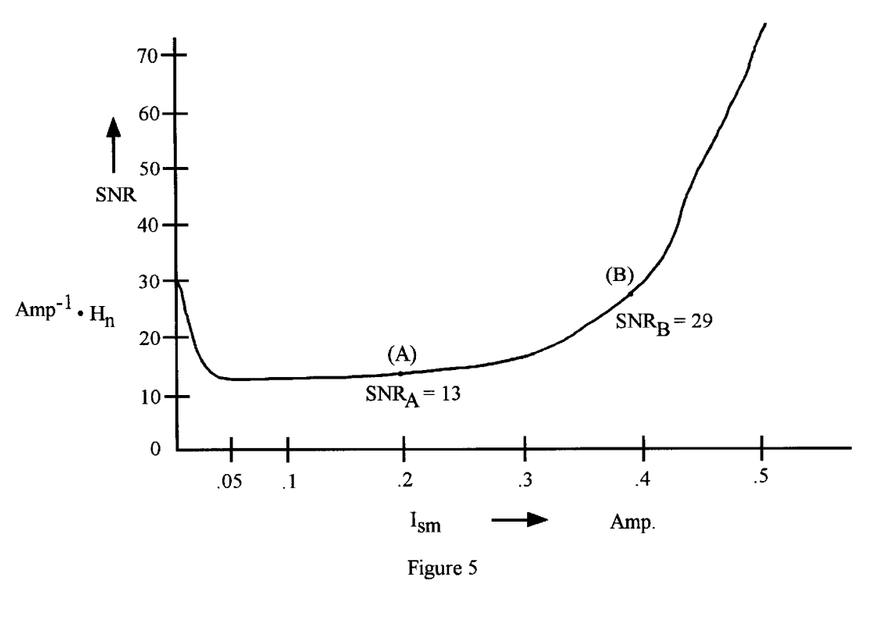
FIG. 5 is a graphical representation of how signal to noise ratio (SNR) is improved by increasing $I_{sm}$.

FIG. 5, ibid, defines SNR, and relates it to $$I_{sm} \cdot H_{sm} = \frac{N_s I_{sm}}{1}.$$

The combiner and noise canceling means taught in copending patent application Ser. No. 08/579,395 was found to be highly specialized. For example, a MEC calibrated for a Jeep would be fine when used on a Jeep production line, but recalibration was required for use on a Ford, or on a steel guy wire. What is more often wanted is a broadly applicable error reduction method. This invention of the MER2 supplies that need.

In addition, the MEC2 (a MEC using a MER2 sensor) will not be as "fussy", i.e., it will not be as sensitive to a change in the position of the noise magnet. This will make the MEC work better in more applications.

We all thought that a uniform toroid core with uniform and symmetrical winding was the ideal, and to be approximated to the degree feasible. This is made clear in columns 7, 8, 15, and 16 in U.S. Pat. No. 3,768,011.

This uniform winding criteria is continued all through the MEC and MER Work of copending application Ser. No. 08/579,395.

MER2 was a major change in thinking. No longer was the winding on the sensor core to be uniform as before. Instead, I asked my co-worker Mr. Ron Jasch to make a sensor with twice as many winding turns per linear inch of core perimeter (double the winding density) in the sector near the lips of the split toroid core. This was the simplest way we knew of doubling $H_{sm}$ near the lips, and it worked. The average sensitivity of the sensor to nearby magnets was halved or better. Put another way, the signal to noise ratio SNR was more than doubled when compared with the usual MER. Hence the name MER2.

Turns density or winding density could just as well be expressed as the number of winding turns per linear centimeter of magnetic material circumference. I sometimes use "linear inch" or "bunched" for short.

DESCRIPTION

This invention relates to an improvement in the sensor for a Swain type clamp-on DC Ammeter.

PRIOR ART

Figure 1:
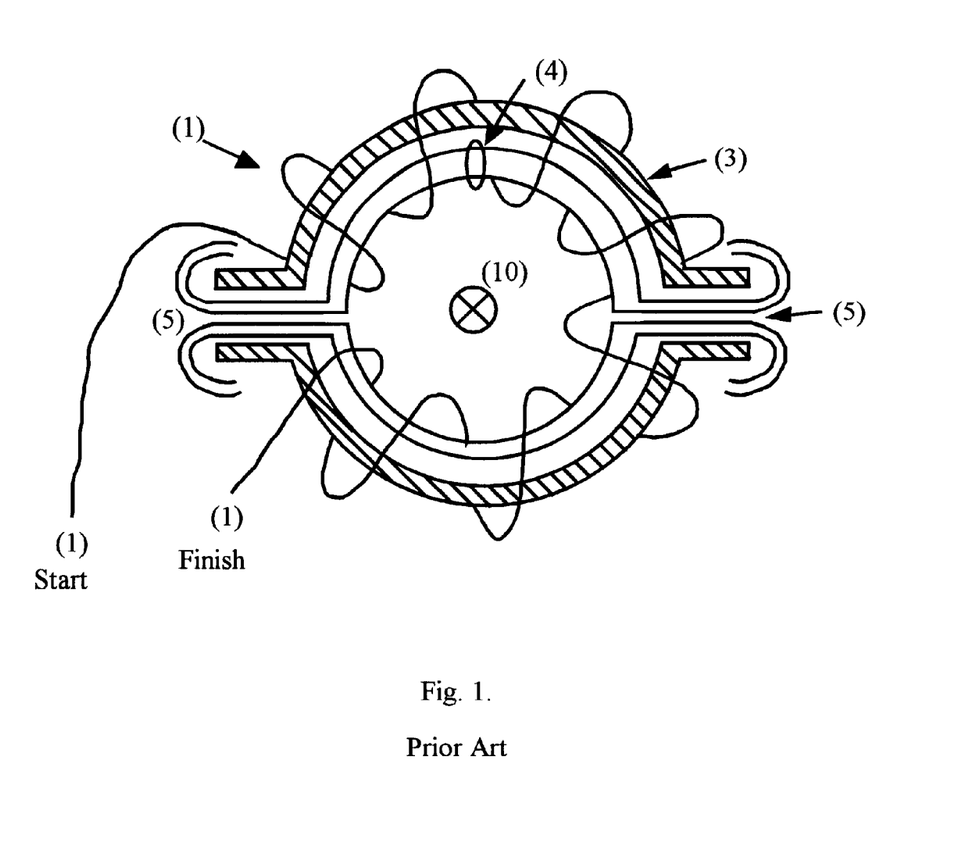
FIG. 1 is a schematic illustration of a typical 5" sensor of the past.

FIG. 1 is a schematic representation of the Prior Art, i.e., what was the preferred structure for the sensor. Here the main feature is that the winding (1) on the core having magnetic steel $f_e$ (4) is uniform, in so far as practicable.

FIG. 1 show our previous typical 5" sensor having the then preferred uniform winding (1) on the core (4). A then preferred uniform winding (1) is wound on the core having an aluminum frame (3). Fine magnetic steel $f_e$ (4) is laid on the frame and extends through the lips (5). The lips (5) are separated when the core is placed around the conductor carrying the current I (10) to be measured. The lips (5) close and hold the ends of the steel $f_e$ (4) in close contact to minimize magnetic path reluctance while the current I (10) is being measured.

The magnetic material we typically use is square permalloy 80, or "D" material from Magnetics Inc, Butler, Pa. But this need not be so. We have used split cores made of ferrite and other magnetic material. We expect we will prefer glass-like amorphous magnetic materials such as Metglas® B, Metglas G, and Metglas E for some applications.

In this art, the preferred uniform winding was stated in U.S. Pat. No. 3,768,011. It was well accepted that a uniformly wound toroidal structure would give best results. See column 7, line 43; column 8, line 19, and column 15, line 60. In column 16, lines 4 to 11, it is especially clear that a uniform winding was favored. It says:

"The preferred clip on structure shown in FIG. 4 approaches the ideal noise canceling properties of a toroidal core SQ with windings 9 & 10 laid around and over the core with nearly perfect uniformity and symmetry in distribution of winding turns all around the core."

"The nearly ideal noise canceling properties of a uniformly wound toroid . . . "

The Prior Art still favored a uniform winding such as illustrated in FIG. 1 when I wrote copending application Ser. No. 08/579,395 and sent it in on Dec. 12, 1995. Page 12, paragraph 5 says:

"A uniform coupling sense winding $N_s$ (2) of about 1000 turns of #22 magnet wire. A symmetrical and balanced form is preferred."

Figure 2:
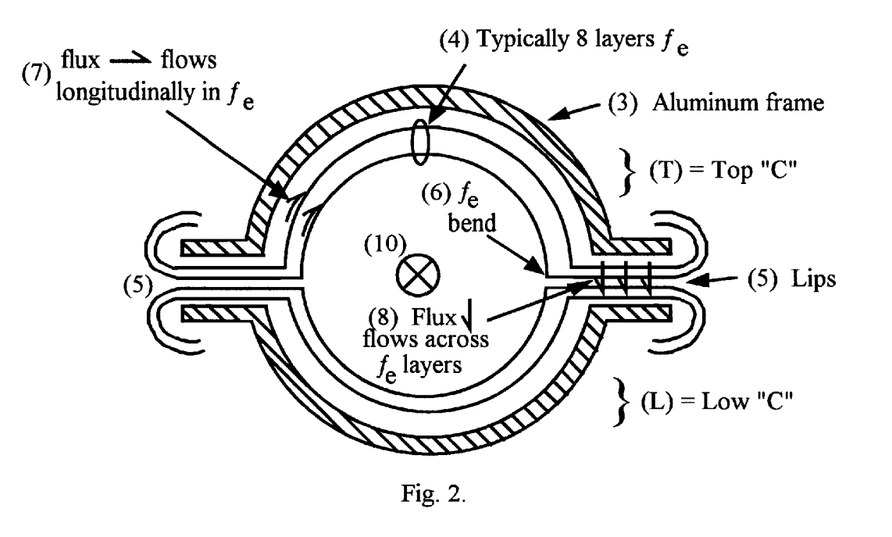
FIG. 2 is a schematic illustration of a typical core for a sensor.

Prior art and to some degree present art preference is illustrated in the sensor core construction shown in FIG. 2. This illustrates the Core of a MER Sensor, and details the path of flux in steel $f_e$ due to input current (10). FIG. 2 is a schematic illustration of a typical core for a sensor, arranged to show the path of magnetic flux (7) in the core $f_e$ (4) due to the current I (10) flowing in a conductor in the aperture of the core. The flux (7) flows longitudinally in steel $f_e$ (4) in the cylindrical sector of the core.

The steel $f_e$ (4) is bent at (6) to go out on the lips (5) which magnetically connect the top "C" (T) of the core to the low "C" (L) of the core. In the lip sector, the flux (8) flows across the layers of steel (4).

The fairly high magnetic reluctance of the lips (5) is thought to be due to the bend (6) where the magnetic steel (4) is cold worked to fit the lips. This cold work likely reduces the magnetic permeability of the steel (4).

High magnetic reluctance here refers to a difficult magnetic path where a relatively large ampere turn magnetomotive force $H_{sm}$ is required to get the flux through the lips.

High magnetic permeability is the inverse of high reluctance. When a magnetic material has high permeability, only a relatively small $H_{sm}$ is needed to get the flux through the material.

In addition, the flux (8) flows across the layers of magnetic steel $f_e$ in the lips. There are two objections to this. The high permeability steel $f_e$ has longitudinal flux (7), but transverse flux (8) goes cross grain. So grain oriented steel is likely poor in this lip construction. We use Magnetics Inc. Hi $\mu$ 80 (code D) steel $f_e$ which is believed to be largely not grain oriented. A true amorphous steel $f_e$, with no preferential direction of flux flow may soon be preferred.

A further difficulty with the lip structure of FIG. 2 is that as the flux (8) flows across the magnetic steel $f_e$, it will give rise to eddy currents. These reduce efficiency. The problem is reduced if the laminations of steel $f_e$ (4) are thin and have high resistivity. We have been using 4D material (0.004 inch thick D type steel) from Magnetics Inc. I think the newer amorphous materials may work better.

FIG. 3 illustrates how the prior art inadvertently went the wrong way in using a non-uniform core winding. Here the "bunch" of "high density" turns (9) is in the center sector of each "C" of the core—as far as can be from the lips. We now know that this is not desirable.

FIG. 3 is a schematic illustration of a previous small typical ¾" diameter aperture sensor winding. Unlike the larger 5" sensor in FIG. 1, in the past, the winding on a small ¾" sensor naturally "bunched" in the center sector of each "C". The "bunching" is represented by winding (9). Winding (9) was connected series aiding with the then preferred uniform winding (1). It came about because it is more difficult to wind many layers of magnet wire right up to the edge of the coil at the lip. Unless special precautions are taken, the turns are likely to spill over into the lip sector, making a mess. Under the mistaken impression that, especially in a small sensor, it was mainly the total number of turns $N_s$ that mattered, we fell into a habit of placing more of the turns where they would hold their place more easily— in the center of a "C". These made fine clips with regard to sensitivity, stability, and reduction of zero offset error due to magnetic fields, both uniform as in the Earth's magnetic field, and also non-uniform as in fields of force due to local magnets. However, there was plenty of room for improvement, especially with regard to non-uniform fields.

New Art

FIG. 4 is a schematic representation of this invention. Here the high density (HD) ("bunched") core winding is near the lips.

By the grace of God, while measuring the sensitivity to close magnetic fields of diverse sensors, I realized that the lips were the problem. And we should "MER" the lips especially hard.

It worked. The lips acted as though their magnetic reluctance was reduced. They acted to better magnetically connect the two halves of the core.

By "MER" the lips, I refer to increasing the flux density switching ampere-turn product, i.e., $H_{sm}$ of the core near the lips.

The lips are used to magnetically connect the magnetic material in the top half of the core in FIG. 2 to that in the bottom half. They were not as effective connectors as wanted when a magnet was nearby. The "MER" approach—high $H_{sm}$—had worked before. Try it again, this time near the lips.

FIG. 4 shows the newly preferred sensor winding form having non-uniform "bunching" of winding (2) near lips (5). The high density (HD) winding is near lips (5).

Unlike any of the prior art, the winding (2) is added—series aiding uniform winding (1). The effect is to "bunch" the non-uniform windings (1) and (2) near the lips—something not proposed or done in the prior art.

$H_{sm}$ here means ampere turns. The more conventional $H_{sm}$ means ampere turns per meter. In both, ampere is $I_{sm}$.

High $I_{sm}$, which produces high $H_{sm}$, is described in copending application Ser. No. 08/579,395, especially in connection with "Discovery", "Essential Characteristics" FIGS. 4 and 5. FIG. 5 of Dec. 21, 1995 is reprinted here for convenience, as FIG. 5 of this application.

FIG. 5 is a graphical representation of how signal to noise ratio (SNR) is improved by increasing $I_{sm}$.

This FIG. 5 is taken from the Dec. 21, 1995 copending application Ser. No. 08/579,395, page 58. The ampere turn magnetization is now called $H_{sm}$. It is still the product of $I_{sm}$ and the number of turns of the core winding $N_s$. In the present invention, one of the independent variables may be the number of turns $N_s$, ($I_{sm}$ may be constant) and also where the turns $N_s$ are placed relative to the lips of the core.

The Dec. 21, 1995 caption for FIG. 5 includes a definition of SNR. Expressed in words, SNR of a clamp-on DC ammeter equals the sensitivity of the output V to an input current I divided by the sensitivity of the output V to a noise N due to a nearby magnet. High SNR means that the output V is far more sensitive to a direct current input I to be measured than to a magnetic noise N. This caption read:

"Signal to Noise Ratio (SNR) for Non-Uniform Field $H_n$ vs

Operating Parameter $I_{sm}$ for

5" dia. Aperture Clip #88 in SN 2336

$$SNR \equiv \dfrac{\dfrac{\delta V}{\delta I} \swarrow \text{input}}{\dfrac{\delta V}{\delta N} \Big\} \dfrac{\text{output}}{\text{noise}}}^{\text{output}}$$

$$= \dfrac{\text{gain}}{\text{gain} \cdot \dfrac{\delta \acute{O}}{\delta N}} \swarrow \dfrac{Z}{g} = \begin{array}{l}\text{equivalent input offset } I\\ \text{per}\\ \text{unit non-uniform field } H_n''\end{array}$$

In FIG. 5 the Operating Parameter $I_{sm}$ sets the signal to noise ratio SNR. At point (A), the signal input current I is 13 units for every one unit of noise N, so SNR is 13. At point (B), the SNR is up to 29, so the measurement of I will be twice as accurate under certain nearby magnet noise N conditions, because the response to noise is half as much while the response to the measured input current I remains the same.

The Dec. 21, 1995 teaching of application Ser. No. 08/579,395 emphasized Operating Parameter $I_{sm}$ because this was the then readily accessible independent variable. This present description emphasizes $H_{sm}$, i.e., the peak ampere turn magnetomotive force used to switch the flux density of the steel $f_e$ (4) in FIG. 1.

$H_{sm}$ is the product of $I_{sm}$ multiplied by the number of turns $N_s$ in the winding of the sensor. Restated:

$$H_{sm} = N_s I_{sm}.$$

The invention occurred when I saw both the problem (Lips (5) in FIG. 1), and also the solution (more $H_{sm}$ near the lips). It worked! This is the origin of"MER2".

This relationship between $H_{sm}$, $I_{sm}$, and $N_s$ is well known. I stated it in U.S. Pat. No. 3,768,011, column 4, lines 43 to 47. It was also expressed in the last 5 lines of original claim 12, page C9 of application Ser. No. 08/579,395, and elsewhere.

Elsewhere I use the conventional form $$H = \frac{N_s I_{sm}}{1},$$

where 1 is the mean flux path length.

In MER2, 1 is not as clear, so I use $H_{sm}$, which is dimensionally equivalent to 1H.

Results

A routine test was used to measure the zero offset stability of three 5" clip sensors. The same magnets were used in the same way on each. AutoMER indicator SN 2517 drove MER and MER2 with the same $I_{sm}$, i.e., at condition "B" on FIG. 5. "Standard" clip #88 was driven at condition "A" on FIG. 5 by standard indicator #0044.

These magnets and their use are different from the Dec. 21, 1995 tests of application Ser. No. 08/579,395. Here, the north pole of the magnets was applied radially to the sensor at center; (about 90° and 270°); toward the "nose" (about 45° and 315°) and toward the tail (about 135° and 225°).

Table 1 is a comparison of test results on three sensors having 5" diameter aperture. Zero offset error, SNR, and normalized gain change are tabulated to show the effect of two magnets, the moderate strength ½ socket wrench, and the strong magnet made of 9 disc magnets.

Table 1 compares "standard" 5" clip #88, "MER" 5" clip #576, and MER2 clip #E8–18.

In Table 1, 5" standard clip #88 looks a lot better than I expected, likely because it was uniquely well made.

Clip #88's most notable weakness appears in the right hand column headed $$\left(\frac{g_m}{g_0}\right)^{-1}.$$

Clip #88 measured 1.22. This means that the strong magnetic field of 9 discs (each 0.7" diameter and 0.2" long—spaced away from the outer periphery of the clip a distance of ⅝") was enough to locally saturate the iron core so much that the average gain was reduced to 0.82 of normal. Put another way:

The average sensor #88 gain with the 9 disc magnet held ⅝" off the sensor in six radial positions, (called $g_m$), divided by the sensor #88 gain free of any magnet, (called $g_0$) equals 0.82.

I am personally able to "feel" the ratios better when the number is greater than unity, so I tabulate the reciprocal, which is 1.22.

Restated:

$$\left(\frac{g_m}{g_0}\right)^{-1} = 1.22.$$

Here gain is defined as the sensitivity of a clamp-on DC ammeter output V to a direct current I to be measured flowing through the aperture of the sensor clip.

This says that the sensor gain in the presence of the strong magnet is down 22% from normal. This is a potentially serious shortcoming. The user can usually sense when there is a lot of zero offset error because the measurement changes a lot with a moderate change in the position of the sensor. The user can use the floating zero procedure to average out much of the error. But generally, he will not know that the gain—i.e., the sensitivity of the output to a change in the input current I to be measured—is down 22%. He can by a small portable current source and do an on-the-spot calibration, but it is not likely. Gain is sneaky.

In short, the best of standard sensors has quite a large loss of gain when near a magnet this strong.

Table 1 shows that both the MER and the MER2 have notably more stable gain in the presence of this strong magnet.

$$\left(\frac{g_m}{g_0}\right)^{-1}$$

for both is 1.06. Both lose only 6% gain, instead of 22%. This is an unexpected benefit. It may prove quite important.

I set out to reduce zero offset error due to a nearby magnet of moderate or strong magnetism. I was thankful to see success. Several experiments with both ¾ inch and 5 inch sensors corroborated our conclusions. Table 1 presents an example.

MER #576 had an average zero offset error of 0.57 Ampere equivalent input current I when the North Pole end of a moderately magnetized ½" socket wrench was placed on the epoxy outer rim (or 1/16" off the winding if no epoxy). The magnet was placed radially; at about 45°, 90°, 135°, 270°, and 315°. The 45° off the lip to lip radius may have been closer to 30 degrees, i.e., 45° . . . 315° may have been closer to 30° . . . 330°. What was more important was that the positions were the same on each 5" sensor because the work was guided by a template under the sensor.

The "MER2" clip was called E8–18 because it was experimental. Table 1 shows that whereas MER #576 had 0.57 A offset, MER2 #E8–18 had only 0.18 Amp average zero offset error due to the ½" socket wrench magnet. This 3 to 1 improvement was a pleasure to see. It means that the error—here called Noise N, is only ⅓ as much. Since all readings were normalized to amperes equivalent input current I, the signal S was the same.

Therefore, the signal to noise ratio is up 3 to 1 over MER. Table 1 presents this with reference to a 10 Amp input. For the ½" socket wrench magnet, SNR of MER2 is 56 to 1, i.e., a lot better than the MER at 18 to 1.

When the strong 9 disc magnet was applied, the SNR result was similar. Table 1 shows that the average zero offset error of MER was 5.4 Amp equivalent input current. So based on 10 Amp input, SNR was two to one.

The MER2 tested better. Its offset was 1.4 Amp, so the SNR is 7 to 1 referenced to 10 Amp input. Thus the MER2 provided a 3½ to 1 benefit in SNR.

Results were not as good with the ¾" clip because we have not yet got enough "bunching" of turns at the lips. There was however, a real improvement.

Construction

Core Structure

To build a 5" diameter aperture MER2 type sensor, Mr. Ron Jasch forms an aluminum frame (3) somewhat as shown in FIG. 2. He uses 0.75"×0.125" type 6063-T52 aluminum bar formed to a pair of about 6" diameter semicircles. Lips (5) are formed by sharp bending the aluminum (3) out so that the lips are parallel to the diameter, and cut off at about ⅜".

For a MER or MER2 clip, we carefully put 8 layers ("Standard" clips have 5 layers of steel $f_e$ (4)) of Magnetics, Inc.—Butler, Pa. type 4D steel $f_e$ (4) sliced at 0.725" width inside the aluminum (3). The ends of the steel $f_e$ (4) are carefully bent to conform to the lips (5) at (6), and then folded over about ¼" on the back of the lips (5) to be secure. Steps are taken to get good occlusion of the lips.

Insulation and padding for the windings (1) and (2) in FIG. 4 are provided by several layers of helix wound ¾" wide fiberglass adhesive tape made by Ameritape in Jacksonville, Fla.

Winding the Core

The now preferred way to do the "C" winding is called the "double HD quarter" scheme. It is to close space wind (In FIG. 4: winding (1)) continuously and uniformly #22 gauge heavy armored poly thermaleze (HAPTZ) magnet wire to fill the full space between lips—first one layer, and then another over the top. This forms two close spaced uniform winding (1) layers. Then without break in the wire, two more layers (winding (2)) are added, each only filling the HD, or high density parts of the "C"s near the lips.

This single winding step is a more economical way of affecting the two step process shown for clarity in FIG. 4. The first two uniform and fill "C" windings are schematically represented by winding (1). The last two symmetrical, but not non-uniform windings are represented in FIG. 4 by winding (2). A ¼" to ½" lead space helix winding is used to get from a high density "nose" part of winding (2) to a high density "tail" part of the winding (2).

"Nose" on a clip type sensor is the lip (5) pair furthest from the handle. "Tail" is the other lip (5) pair, nearer the handles.

Before doing the winding (2), the two "C" sections of five inch sensor #E8–18 were marked in quarters. The central two quarters got only two layer winding (1). The high density (HD) in FIG. 4 nose and tail quarters received the added two layers of winding (2) in FIG. 4.

The total number of sensor turns $N_s$ was about 1800. Then each "C" had about 900 turns. These were in 2 layers of winding (1) in FIG. 4, plus four quarter layers of winding (2), i.e., 3 equivalent full layers. Hence each layer on a single "C" is about 300 turns.

The linear length of winding on one "C" was about 10 inches, i.e., a little shorter than the magnetic material (4) in FIG. 1, in only one "C". Each "C" was divided into 4 sectors of about 2.5 inch length. In FIG. 4, each high density (HD) sector is about 2.5 inches long. Then the turns per HD sector layer is 300/4=75.

Each HD sector has the 2 layers of winding (1), plus 2 layers of winding (2). So the 4 layers of each HD sector contain 300 turns over a 2.5 inch length, i.e., 120 turns per inch of linear winding length. The rest of the core has only winding (1), so the winding density is only 60 turns per inch of winding.

Peak Magnetic Intensity for Switching Flux Density β

The $I_{sm}$ driving the series aiding connected windings from AutoMER SN 2517 was about 0.36 Amp peak flux density switching current. $I_{sm}$ is the Operating Parameter $I_{sm}$ in copending patent application Ser. No. 08/579,395; and also the abscissa in FIG. 5 herein. Then the full core with windings (1) and (2) totaling 1800 turns e up a peak ampere turn field $H_{sm}$ of 0.36 Amp times 1800 turns, or 648 Amp turns $H_{sm}$ over its full flux path length (1) of about 20 inches (0.50 meter). So averaged, $$H_{sm} = \frac{N_s I_{sm}}{1} = \frac{H_{sm}}{1}$$

$$\doteq \frac{1800 \text{ turn} \times .36 \text{ Amp}}{.50 \text{ Meter}} = \frac{648 \text{ Amp turn}}{0.5 \text{ Meter}}$$

$$\text{Average } H_{sm} = 1296 \frac{\text{Ampere turn}}{\text{Meter}}$$

Peak flux density switching magnetic field

But this is not uniformly distributed around the core. It is symmetrical, but not uniform. Each high density (HD) sector in FIG. 4 has 300 turns in its 2½" linear length. With $I_{sm}$=0.36 Amp peak, this amounts to about 108 Ampere turns $H_{sm}$ in a core winding linear length of 2½ inches, or 43 Amp turns $H_{sm}$ per linear inch near each lip (5). In contrast, in the center sectors more remote from the lips (5), the ampere turns per linear inch is only about half, i.e., 22 $H_{sm}$.

Other Winding Schemes

I tested core E8–18 using only the HD windings. It was not as good at resisting zero offset error due to nearby magnets. I also tested it with only the winding (1). Still not as good. Again both ways with equivalent ampere turns (by adjusting $I_{sm}$). Again not as good. The combination in FIG. 4 is the best so far.

Variations on the doubled HD quarter scheme for winding a MER2 sensor will likely be found superior at a later date—especially for other than 5" sensors. However this is now preferred.

General MER2 Criteria

What counts in building a MER2 is the ampere turn product $H_{sm}$ acting on a HD sector near the lips of the sensor. See FIG. 4. The MER2 concept teaches larger $H_{sm}$ near the lips (5) due to the product of the algebraic sum of all currents ($I_{sm_j}, I_{sm_j}, I_{sm_k}$) driving a winding multiplied by the total turns of the winding, repeated for all windings in a HD sector.

Restated, the MER2 teaching is that the $H_{sm}$ acting on HD near the lips (5) is:

$$\underline{H_{sm}}_{HD} = \left[\sum_i^k I_{sm_j}\right] \times [N_1] + \left[\sum_1^n I_{sm_m}\right] \times [N_2] + \ldots$$

and that this $H_{sm_{HD}}$ exceed that of the more central part of the sensor's core, more remote from the lips (5).

I know that $H_{sm}$ near the lips should exceed that nearer center core, but I do not yet know by how much. I expect it varies with core size, i.e., sensor size. In a 5" sensor, I know that $H_{sm}$ in the center should exceed zero when the quartering turns layout is used.

Non-Uniform Driving Current $I_{sm}$

In FIG. 4, I show the now preferred winding scheme. "Bunching" of winding turns near the lips (5) satisfies the above "general MER2 turns criteria", but it is not the only way. We could instead "bunch" $I_{sm}$ current sources into sectors of a uniform winding. For example:

The single uniform winding (1) in FIG. 1 could be split into quarter sectors like FIG. 4, but instead of adding turns or separate winding (2) we could add $I_{sm}$ current sources to the windings (1) nearer the lips (5). Then the turns (1) nearer the lips (5) could be driven by both current source $I_{sm_j}$ and $I_{sm_k}$. The resulting $H_{sm}$ nearer the lips could be the same as for FIG. 4, since the central part of winding (1) would be driven by only one current source.

This is a non-uniform driving current $I_{sm}$ scheme, or current "bunching" scheme, which could be built to produce the same $H_{sm}$ effect for MER2 action as the winding turns "bunching" (1) and (2) shown in FIG. 4.

TABLE 1

| 5" Sensors | Average zero offset error due to magnetized socket wrench | SNR @ 10 Amp input | Average zero offset error due to 9 disc magnet | SNR @ 10 Amp input | $\left(\frac{g_m}{g_0}\right)^{-1}$ |
|---|---|---|---|---|---|
| "Standard" #88 | .77 A | 13 to 1 | 4.7 A | 2 to 1 | 1.22 |

TABLE 1-continued

| 5" Sensors | Average zero offset error due to magnetized socket wrench | SNR @ 10 Amp input | Average zero offset error due to 9 disc magnet | SNR @ 10 Amp input | $\left(\frac{g_m}{g_0}\right)^{-1}$ |
|---|---|---|---|---|---|
| "MER" #576 | .57 A | 18 to 1 | 5.4 A | 2 to 1 | 1.06 |
| "MER2" #E8-18 | .18 A | 56 to 1 | 1.4 A | 7 to 1 | 1.06 |

I claim:

1. Improved sensor for a Swain type clamp-on direct current ammeter having better signal to noise ratio (SNR) when acted upon by an undesired noise N source comprising an undesired magnetic field, including:
   a split core with magnetic material which is magnetically connected by lips when the said split core is closed around a conductor carrying a current I to be measured; and
   on said core a winding $N_S$ suited for switching the flux density β of said magnetic material when driven by a current called operating parameter $I_{sm}$; and
   at least one of said core constructed with a non-uniform magnetic structure designed to concentrate the ampere turn $H_{sm}$ magnetomotive force from said current called $I_{sm}$ flowing in said winding $N_S$ so that the said flux density β of said magnetic material in and about said lips is better switched, and
   said winding is wound in a non-uniform manner such that the turns are more bunched in high density winding sectors near the said lips; so that there is a greater number of turns per linear inch of core perimeter near the said lips so that thereby the said $H_{sm}$ adjacent to the said lips is greater than that in other sectors of said core more remote from said lips.

2. Improved sensor as claimed in claim 1 wherein said Swain Ammeter is of the MER type, such that the said product of said operating parameter $I_{sm}$ and said winding turns $N_S$ is substantially greater than that corresponding to a low said SNR.

3. Improved sensor as claimed in claim 1 wherein said Swain Ammeter is of the MEC type characterized by means for combining signals, and means to adjust said combining so that said noise N is largely canceled.

4. Method for making an improved sensor for a Swain Type clamp-on direct current ammeter having better signal to noise ratio when acted upon by an undesired noise source comprising an undesired magnetic field comprising the steps of:
   obtaining or constructing at least one of a non-uniform magnetic structure and a non-uniform winding to become part of a said sensor; obtaining or constructing said sensor to include a split core;
   providing magnetic material in said core, and magnetically connecting said magnetic material to lips;
   constructing said lips to act as a relatively low reluctance magnetic path from one part of said magnetic material to another so that the parts of said split core are magnetically connected when said split core is closed around a conductor carrying a current to be measured, and at least one of:
   forming said non-uniform magnetic structure into said core and magnetically connecting to said lips so as to concentrate the ampere turn magnetomotive force $H_{sm}$ such that the flux density β of said magnetic material in and adjacent to said lips is better switched; and
   laying up said non-uniform winding on said magnetic structure in said core so that the turns of said winding are bunched in high density winding sectors near said lips such that the number of said turns per unit length of said magnetic structure is greater near said lips and lesser in sectors of said magnetic structure more remote from said lips, and thereby said $H_{sm}$ is greater near said lips.

5. Method for making an improved sensor as claimed in claim 4 wherein said Swain Ammeter is of the MER type, the method further comprising the step of: constructing said ammeter with a generally greater product of said winding turns, and said current magnitude $I_{sm}$ so that the said SNR achieved is substantially greater than the said SNR would be if said product were significantly less.

6. Method for making an improved sensor as claimed in claim 4 wherein said Swain Ammeter is of the MEC type, the method further comprising the step of: combining and adjusting signals so that said noise is largely canceled.

7. Improved sensor for a Swain type clamp-on direct current ammeter having better signal to noise ratio (SNR) when acted upon by an undesired noise N source comprising an undesired magnetic field, including:
   a split core with magnetic material which is magnetically connected by lips when the said split core is closed around a conductor carrying a current I to be measured; and
   on said core a winding $N_S$ suited for switching the flux density β of said magnetic material when driven by a current called operating parameter $I_{sm}$; and
   said winding is wound in a non-uniform manner such that the turns are more bunched in high density winding sectors near the said lips; so that there is a greater number of turns per linear inch of core perimeter near the said lips so that thereby the $H_{sm}$ adjacent to the said lips is greater than that in other sectors of said core more remote from said lips.

* * * * *